US010393607B2

(12) United States Patent
Matsunami et al.

(10) Patent No.: US 10,393,607 B2
(45) Date of Patent: Aug. 27, 2019

(54) SEMICONDUCTOR SENSING DEVICE

(71) Applicant: FUJI ELECTRIC CO., LTD., Kawasaki-shi, Kanagawa (JP)

(72) Inventors: Kazuhiro Matsunami, Matsumoto (JP); Mutsuo Nishikawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 88 days.

(21) Appl. No.: 15/609,667

(22) Filed: May 31, 2017

(65) Prior Publication Data

US 2017/0363494 A1    Dec. 21, 2017

(30) Foreign Application Priority Data

Jun. 16, 2016    (JP) ................................ 2016-120280

(51) Int. Cl.
| | |
|---|---|
| *G01L 9/00* | (2006.01) |
| *H03K 5/24* | (2006.01) |
| *H01L 27/06* | (2006.01) |
| *H01L 27/092* | (2006.01) |
| *H03K 19/20* | (2006.01) |
| *H03K 17/687* | (2006.01) |

(52) U.S. Cl.
CPC .......... *G01L 9/0098* (2013.01); *H03K 5/2481* (2013.01); *H03K 19/20* (2013.01)

(58) Field of Classification Search
CPC ............................ H05K 5/2481; H05K 19/20
See application file for complete search history.

(56) References Cited

U.S. PATENT DOCUMENTS

| | | |
|---|---|---|
| 2003/0197513 A1 | 10/2003 | Uematsu et al. |
| 2010/0097146 A1 | 4/2010 | Nishikawa et al. |

FOREIGN PATENT DOCUMENTS

| | | |
|---|---|---|
| JP | 2003-304633 A | 10/2003 |
| JP | 2010-119091 A | 5/2010 |
| JP | 2011-097789 A | 5/2011 |
| JP | 5549159 B2 | 7/2014 |

*Primary Examiner* — Seahvosh Nikmanesh
(74) *Attorney, Agent, or Firm* — Rabin & Berdo, P.C.

(57) ABSTRACT

A semiconductor sensing device generates an output based on a sensor. A connection point of an output circuit constituted by first and second switching output elements connected so as to be complementary is connected to an output terminal. Between the first switching output element and the connection point of the output circuit, a first switching element is connected. Between the second switching output element and the connection point of the output circuit, a second switching element is connected. When voltage of the output terminal is a voltage lower than a lower limit clamp voltage, the first switching element turns OFF. When the voltage of the output terminal is a voltage higher than an upper limit clamp voltage, the second switching element turns OFF.

10 Claims, 14 Drawing Sheets

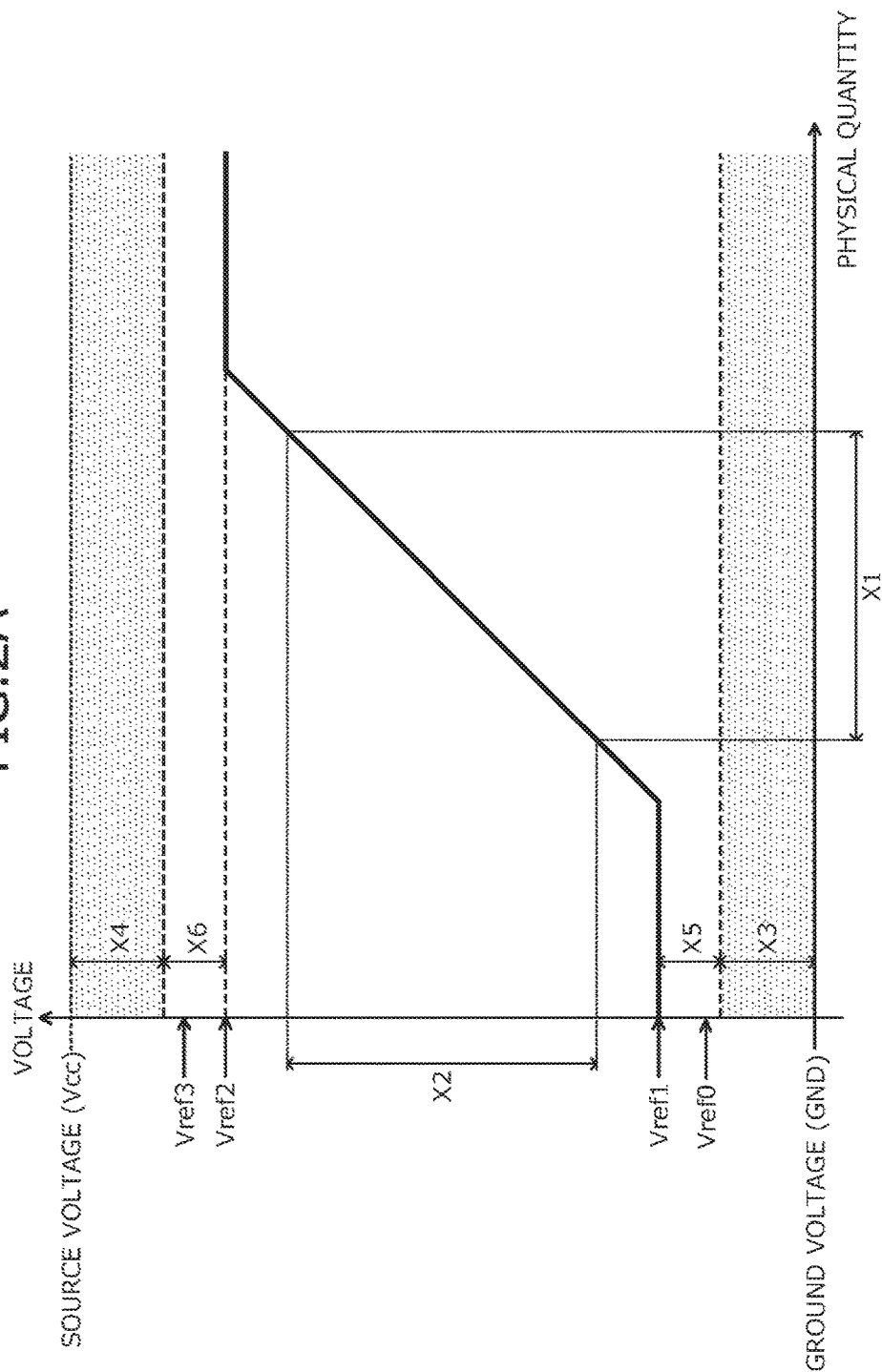

FIG. 2B

| | | $Vout \leq Vref0$ | $Vref0 < Vout < Vref1$ | $Vref1 \leq Vout < Vref2$ | $Vref2 \leq Vout \leq Vref3$ | $Vout > Vref3$ |
|---|---|---|---|---|---|---|
| HIGH SIDE | THIRD OPERATIONAL AMPLIFIER | H | L | L | L | L |
| | SECOND OPERATIONAL AMPLIFIER | L | L | L | H | H |
| | OR CIRCUIT | H | L | L | H | H |
| | SECOND SWITCH | OFF | ON | ON | OFF | OFF |
| LOW SIDE | FIRST OPERATIONAL AMPLIFIER | L | L | H | H | H |
| | FOURTH OPERATIONAL AMPLIFIER | H | H | H | H | L |
| | AND CIRCUIT | L | L | H | H | L |
| | FIRST SWITCH | OFF | OFF | ON | ON | OFF |

SEMICONDUCTOR SENSING DEVICE

CROSS REFERENCE TO RELATED APPLICATIONS

This application is based upon and claims the benefit of priority of the prior Japanese Patent Application No. 2016-120280, filed on Jun. 16, 2016, the entire contents of which are incorporated herein by reference.

BACKGROUND OF THE INVENTION

1. Field of the Invention

Embodiments of the invention relate to a semiconductor sensing device.

2. Description of the Related Art

Sensor integrated circuit (IC) devices that convert a physical quantity or force, such as pressure, acceleration, or the like into voltage and output the voltage are commonly known. FIG. 5 is a characteristics diagram of output characteristics of a conventional sensor IC device. As depicted in FIG. 5, accompanying increases in the magnitude of a physical quantity or force, output characteristics of the sensor IC device exhibit linearity. The voltage values increase linearly with a predetermined slope within a predetermined detection range X1 of the physical quantity or force. The range exhibiting this linearity is set as a detection range (hereinafter, normal detection range) X1 of the physical quantity or force during normal operation of the sensor IC device, and voltage of a voltage range (hereinafter, normal output voltage range) X2 corresponding to the normal detection range X1 is output as an analog signal.

Typically, the sensor IC device is connected to a sensor system that performs digital processing of the analog signal of the voltage output from the sensor IC device. FIG. 6 is a block diagram depicting a connection configuration of a sensor IC device and a sensor system. As depicted in FIG. 6, the sensor system 110 includes an analog-to-digital (A/D) converter 111, a computing circuit 112, and a voltage source 113. A sensor IC device 100 includes a non-depicted complementary metal oxide semiconductor (CMOS) as an output circuit.

To a source voltage (Vcc) terminal 101, a ground voltage (GND) terminal 102, and an output (Vout) terminal 103 of the sensor IC device 100 a high potential side, a low potential side, and an output point of an output circuit in the sensor IC device 100 are connected, respectively. Further, the source voltage terminal 101 and the ground voltage terminal 102 of the sensor IC device 100 are connected to a positive electrode and a negative electrode of the voltage source 113, respectively, via a non-depicted source voltage terminal and a non-depicted ground voltage terminal of the sensor system 110. The output terminal 103 of the sensor IC device 100 is connected to the A/D converter 111, via a non-depicted input terminal of the sensor system 110. Analog signals of voltage or the like output from the sensor IC device 100 are converted in digital signals by the A/D converter 111 and subject to computation processing by the computing circuit 112.

In the sensor IC device 100 and the sensor system 110 of such a connection configuration, for example, a connection error is assumed to occur whereby the connection of the source voltage terminal 101 of the sensor IC device 100 and the power source output terminal (not depicted) of the sensor system 110 becomes open (the circuit is released, i.e., disconnected). In this case, voltage of a voltage value different from the voltage value corresponding to the magnitude of the physical quantity or force is output from the output terminal 103 of the sensor IC device 100. However, on the sensor system 110 side, determination of whether the output of the sensor IC device 100 is proper output corresponding to the magnitude of the physical quantity or force, or is errant output at the time of a connection error with the sensor IC device 100 is not possible.

Therefore, recently, in the sensor IC device 100 as well, a self-diagnosis function for detecting connection error with the sensor system 110 is demanded. FIG. 7 is a block diagram depicting another example of a connection configuration of a sensor IC device. FIGS. 8 and 9 are diagrams depicting the voltage range of the conventional sensor IC device. As depicted in FIG. 7, the self-diagnosis function may be a scheme in which resistors 121 to 124 are connected to the source voltage terminal 101, the ground voltage terminal 102, and the output terminal 103 of the sensor IC device 100, respectively. The resistors 121 to 123 are internal diagnostic (self-diagnostic) resistors arranged in the sensor IC device 100, and the resistor 124 is an external resistor arranged externally from the sensor IC device 100. In the figure, although the resistor 124 is depicted as a pull-up resistor connected between the source voltage terminal 101 and the output terminal 103, when the resistor 124 is connected between the output terminal 103 and the ground voltage terminal 102 as a pull-down resistor, self-diagnosis of a connection error is possible.

For example, wiring connecting the power source terminal of the sensor IC device 100 and the power source terminal of the sensor system 110 is assumed to be open. In this case, the voltage output from the output terminal 103 of the sensor IC device 100 to the sensor system 110 is fixed to the voltage value determined by voltage divider resistance by the external resistor 124 and the internal diagnostic resistors 121 to 123 connected to external connection terminals of the sensor IC device 100. Therefore, outside the normal output voltage range X2 of the sensor IC device 100, voltage ranges (hereinafter, error detection voltage range) X3, X4 for detecting connection error of the sensor IC device 100 and the sensor system 110 are set.

The resistance values of the internal diagnostic resistor and the external resistor are determined so that when a connection error of the sensor IC device 100 and the sensor system 110 occurs, voltage (i.e., voltage of the output terminal 103) Vout output from the sensor IC device 100 to an external destination is fixed to a voltage value within the error detection voltage ranges X3, X4. In the sensor system 110, a judging circuit 114 is provided that judges whether output of the sensor IC device 100 is proper output determined according to the magnitude of the physical quantity or force. When the voltage Vout of the output terminal 103 is a voltage value within the error detection voltage ranges X3, X4, the output of the sensor IC device 100 is judged by the judging circuit 114, to be errant output of a connection error with the sensor IC device 100.

On the other hand, the output of the sensor IC device 100 is typically rail-to-rail output that swings from the source voltage Vcc to the ground voltage GND. However, even when the output of the sensor IC device 100 is set to be rail-to-rail output, in actuality, when the output of the sensor IC device 100 approaches the source voltage Vcc and the ground voltage GND, the current capacity of an output element used in the output circuit decreases. Further, by the adverse effects of leak current to the internal diagnostic resistors 121 to 123 and the external resistor 124, the output of the sensor IC device 100 does not reach the source voltage Vcc or the ground voltage GND, and saturation by voltage lower than the source voltage Vcc or by voltage higher than the ground voltage GND occurs.

This saturation voltage varies greatly consequent to output element characteristics of the metal oxide semiconductor field effect transistor (MOSFET), etc. used in the output circuit, manufacturing variation of the resistance values of the internal diagnostic resistors 121 to 123 and variation of the resistance value of the external resistor 124, etc. Therefore, with consideration of variation of the saturation voltage of the sensor IC device 100, as depicted in FIG. 8, a range that is a lower limit saturation voltage Vsat1 on the ground voltage GND side or higher and the upper limit saturation voltage Vsat2 on the source voltage Vcc side or lower is used as the normal output voltage range X2 of the sensor IC device 100.

Further, when a physical quantity or force outside the normal detection range X1 is input to the sensor IC device 100, the output of the sensor IC device 100 changes to the saturation voltage. At this time, no problem particularly arises when the saturation voltage of the sensor IC device 100 is outside the normal output voltage range X2 and outside the error detection voltage ranges X3, X4. However, as described above, the saturation voltage (the lower limit saturation voltage Vsat1 and the upper limit saturation voltage Vsat2) of the sensor IC device 100 is assumed to vary consequent to manufacturing variation error and reach the detection voltage ranges X3, X4 (FIG. 9). In this case, judging whether the output of the sensor IC device 100 is proper output corresponding to the magnitude of the physical quantity or force is impossible.

Therefore, a function for judging whether the saturation voltage of the sensor IC device 100 reaching the error detection voltage ranges X3, X4 is consequent to the magnitude of the physical quantity or force or consequent to adverse effects resulting from arrangement of the self-diagnosis function is demanded. In particular, a function of saturating the voltage output from the sensor IC device 100 to a predetermined voltage value when the voltage Vout of the output terminal 103 is within a range (hereinafter, saturation voltage range) between the normal output voltage range X2 and the error detection voltage ranges X3, X4, independent of the magnitude of the physical quantity or force is demanded.

As a sensor IC device equipped with such a function, a device has been proposed that includes a clamp (limiting) circuit that feeds back the voltage output from the output circuit and when the voltage output from the output circuit is a voltage value outside the saturation voltage range, stops output decreases and output increases of the sensor IC device (for example, refer to Japanese Laid-Open Patent Publication No. 2010-119091).

An example of a sensor IC device equipped with such a clamp circuit is depicted in FIG. 10. FIG. 10 is a circuit diagram of a conventional sensor IC device. FIG. 10 corresponds to FIG. 1 of Japanese Laid-Open Patent Publication No. 2010-119091. FIG. 11 is a diagram of another example of a voltage range of the conventional sensor IC device. A conventional sensor IC device 130 depicted in FIG. 10 includes sensor element (not depicted), first and second output elements 131, 132, first and second switching elements 133, 134, and first and second operational amplifiers 141, 142. The first and second output elements 131, 132 are respectively an n-channel MOSFET and a p-channel MOSFET, are connected via the first and second switching elements 133, 134 so as to be complementary, and configure a CMOS circuit that becomes an output circuit 135.

A connection point of the first and second output elements 131, 132 is connected to the output terminal 103. The first switching element 133 is an n-channel MOSFET arranged between the first output element 131 and the output terminal 103 and connected in series to the first output element 131. The second switching element 134 is a p-channel MOSFET arranged between the second output element 132 and the output terminal 103 and connected in series to the second output element 132. A non-inverting input (+) terminal of the first operational amplifier 141 is connected to the output terminal 103, and an inverting input (−) terminal is fixed at a potential of a predetermined reference voltage (first voltage) Vref1. An output terminal of the first operational amplifier 141 is connected to a gate of the first switching element 133.

A non-inverting input (+) terminal of the second operational amplifier 142 is connected to the output terminal 103, and an inverting input (−) terminal is fixed at a potential of a predetermined reference voltage (second voltage) Vref2. An output terminal of the second operational amplifier 142 is connected to a gate of the second switching element 134. The first operational amplifier 141 has a function of clamping the voltage Vout of the output terminal 103 to the reference voltage Vref1 of the first operational amplifier 141. The second operational amplifier 142 has a function of clamping the voltage Vout of the output terminal 103 to the reference voltage Vref2 of the second operational amplifier 142.

When the voltage Vout of the output terminal 103 is less than the reference voltage Vref1 of the first operational amplifier 141, the output of the first operational amplifier 141 is inverted, becoming a low (L) voltage level (hereinafter, L level) and the first switching element 133 is turned off whereby output decreases of the sensor IC device 130 stop. When the voltage Vout of the output terminal 103 exceeds the reference voltage Vref2 of the second operational amplifier 142, the output of the second operational amplifier 142 is inverted, becoming a high (H) voltage level (hereinafter, H level) and the second switching element 134 is turned off whereby output increases of the sensor IC device 130 stop.

Therefore, as depicted in FIG. 11, the reference voltage Vref1 of the first operational amplifier 141 is set to be the upper limit value of the error detection voltage range X3 on the ground voltage GND side or higher and the lower limit value of the normal output voltage range X2 or lower. The reference voltage Vref2 of the second operational amplifier 142 is set to be the lower limit value of the error detection voltage range X4 on the source voltage Vcc side or lower and the upper limit value of the normal output voltage range X2 or higher. As a result, configuration may be such that during normal operation of the sensor IC device 130, the voltage Vout of the output terminal 103 does not reach the error detection voltage ranges X3, X4. Reference character Vdd is the internal source voltage that uses the source voltage Vcc as a reference.

Further, as a separate device equipped with an output circuit protection function, a device has been proposed that includes a feedback control means that lowers the driving voltage of an output unit when an external load short circuits (for example, refer to Japanese Patent No. 5549159).

Further, a power factor correction circuit has been proposed that when a load short circuit state is detected, opens a path switch arranged on a power transmission path and blocks the power transmission path (for example, refer to Japanese Laid-Open Patent Publication No. 2011-097789).

Yet another device has been proposed that connects a resistance means between wiring lines and lowers the apparent resistance value of a pull-down resistor or a pull-up resistor during disconnection (for example, refer to Japanese Laid-Open Patent Publication No. 2003-304633 (paragraphs 0021 to 0022)).

SUMMARY OF THE INVENTION

According to one aspect of the present invention, a semiconductor sensing device configured to output an electronic signal of a voltage corresponding to a magnitude of a detected physical quantity or force, includes a first switching output element; a second output element connected on a high potential side of the first switching output element so as to be complementary; a first switching element connected to the high potential side of the first switching output element, between the first switching output element and the second output element; a second switching element connected between the first switching element and the second output element; and an output terminal connected to a connection point of the first switching element and the second switching element, the output terminal outputting to an external destination, the electronic signal of a potential of the connection point. The first switching element turns OFF, when voltage of the output terminal is less than a first voltage. The second switching element turns OFF, when the voltage of the output terminal is a second voltage or higher, the second voltage being higher than the first voltage. The second switching element turns OFF, when the voltage of the output terminal is a third voltage lower than the first voltage. The first switching element turns OFF, when the voltage of the output terminal is a fourth voltage higher than the second voltage.

In the semiconductor sensing device, the first switching element turns ON, when the voltage of the output terminal is the first voltage or higher and the fourth voltage or lower.

In the semiconductor sensing device, the second switching element turns ON, when the voltage of the output terminal is higher than the third voltage and lower than the second voltage.

In the semiconductor sensing device, the first switching element is an n-channel metal oxide semiconductor field effect transistor, and the second switching element is a p-channel metal oxide semiconductor field effect transistor.

In the semiconductor sensing device, the first switching output element is an n-channel metal oxide semiconductor field effect transistor, and the second output element is a p-channel metal oxide semiconductor field effect transistor.

The semiconductor sensing device includes a first terminal of a maximum potential, connected on a high potential side of the second output element; a second terminal of a minimum potential, connected on a low potential side of the first switching output element; a first resistor connected between the first terminal and the second terminal; a second resistor connected between the first terminal and the output terminal; and a third resistor connected between the output terminal and the second terminal.

In the semiconductor sensing device, the physical quantity is pressure.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2A is a diagram depicting a voltage range of the semiconductor sensing device according to the embodiment;

FIG. 2B is a table of component operation during operation of the semiconductor sensing device according to the embodiment;

DETAILED DESCRIPTION OF THE INVENTION

Figure 1:
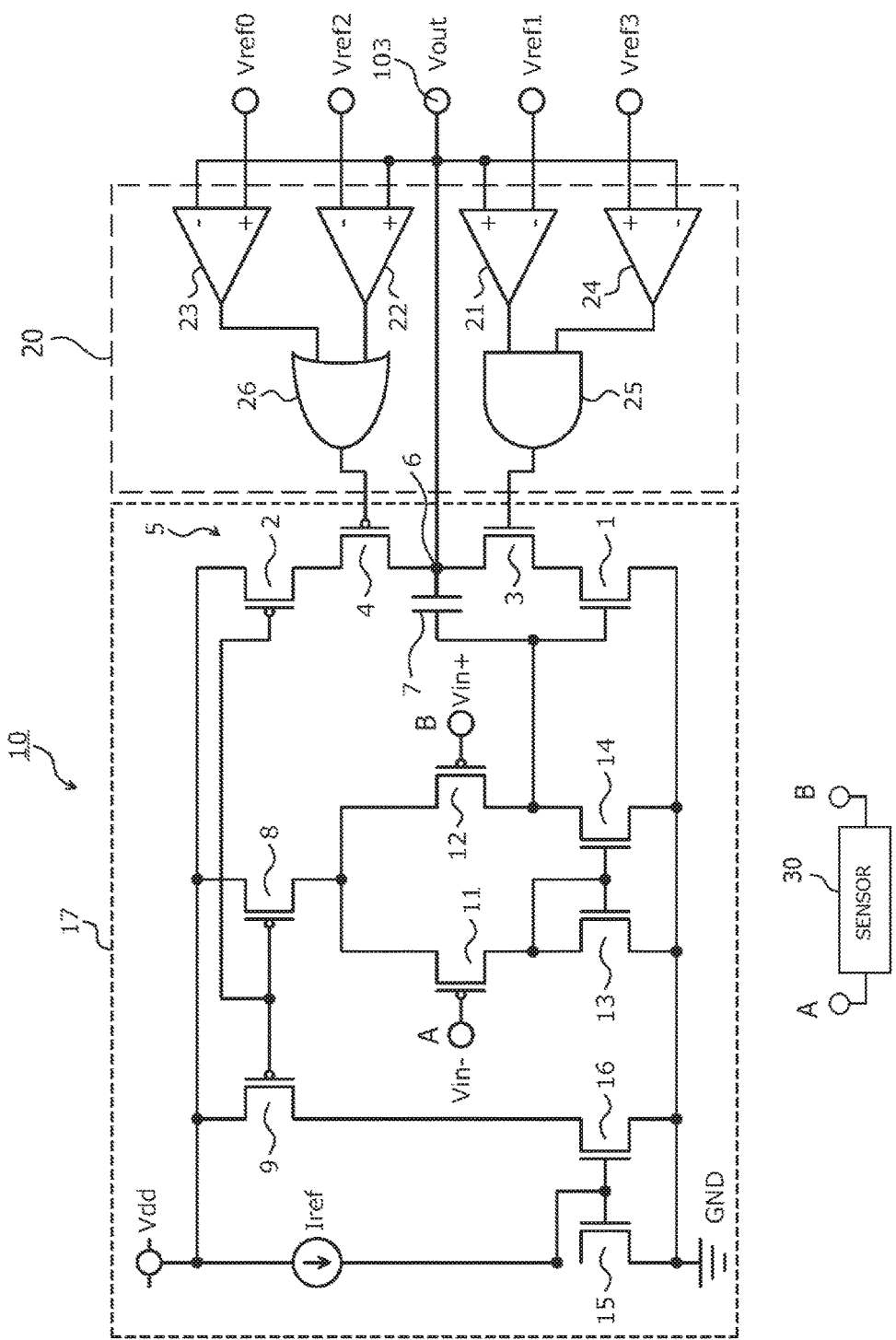
FIG. 1 is a circuit diagram of a semiconductor sensing device according to an embodiment.

Embodiments of a semiconductor sensing device according to the present invention will be described in detail with reference to the accompanying drawings. In the description of the embodiments and drawings, identical constituent parts are given the same reference characters and redundant description will be omitted.

Configuration of a semiconductor sensing device according to an embodiment will be described with reference to FIGS. 1, 2A, and 7. FIG. 1 is a circuit diagram of the semiconductor sensing device according to the embodiment. FIG. 2A is a diagram depicting a voltage range of the semiconductor sensing device according to the embodiment. The semiconductor sensing device according to the embodiment depicted in FIG. 1 is a sensor IC device 10 that converts a physical quantity or force, such as pressure or acceleration, into voltage and outputs voltage of a voltage value corresponding to the magnitude of the physical quantity or force as an analog signal. For purposes of brevity, in the present specification and claims, the term physical quantity may refer to any physical characteristic, including pressure, acceleration, size, weight, mass, speed, tilt, temperature, force, spin, shape, composition, brightness, sound, smell, or any other physical characteristic that may be measured by a sensor. The present invention is not limited to any one type or class of physical quantity or characteristic that is measurable by a sensor.

Accompanying increases in the magnitude of a physical quantity, output characteristics of the sensor IC device 10 exhibit linearity. The voltage values increase linearly with a predetermined slope within the predetermined detection range X1 of the physical quantity. The range exhibiting this linearity is set as the detection range (the normal detection range) X1 of the physical quantity during normal operation of the sensor IC device 10. The sensor IC device 10 outputs voltage of the voltage range (normal output voltage range) X2 corresponding to the normal detection range X1, as an analog signal. The sensor IC device 10 is connected to the sensor system 110 that performs digital processing of the analog signal of the voltage, etc. output from the sensor IC device 10 (refer to FIG. 7).

Figure 7:
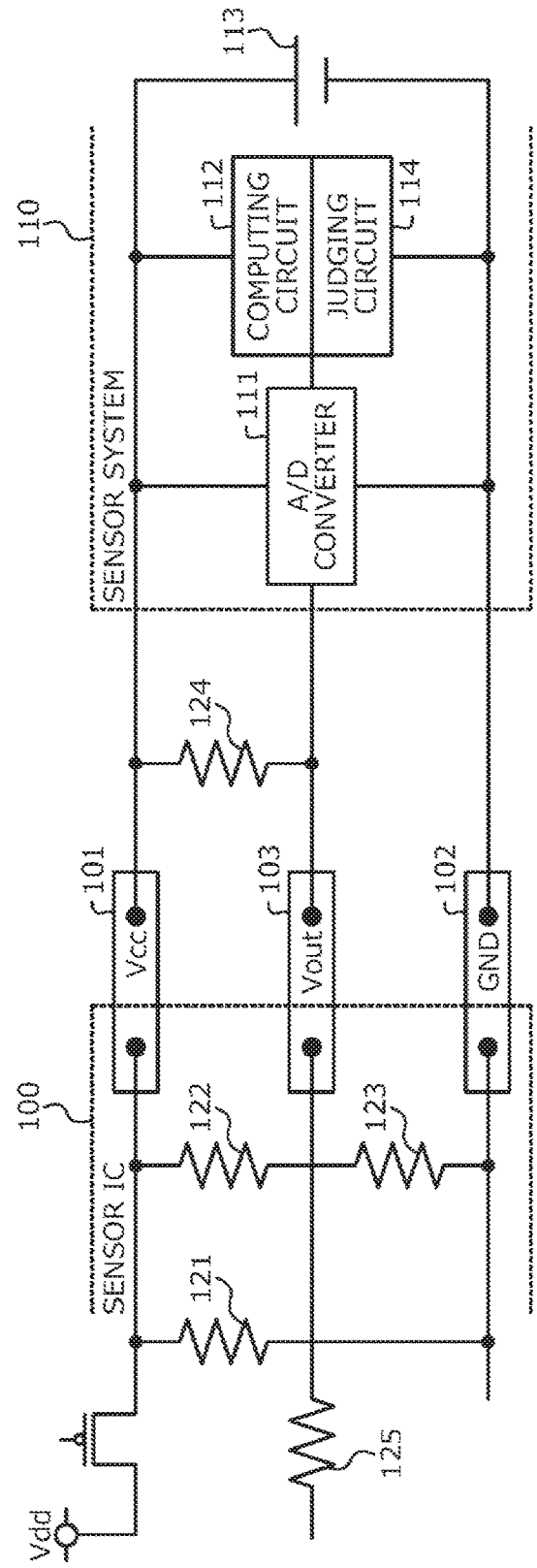
FIG. 7 is a block diagram depicting another example of a connection configuration of a sensor IC device.
Figure 8:
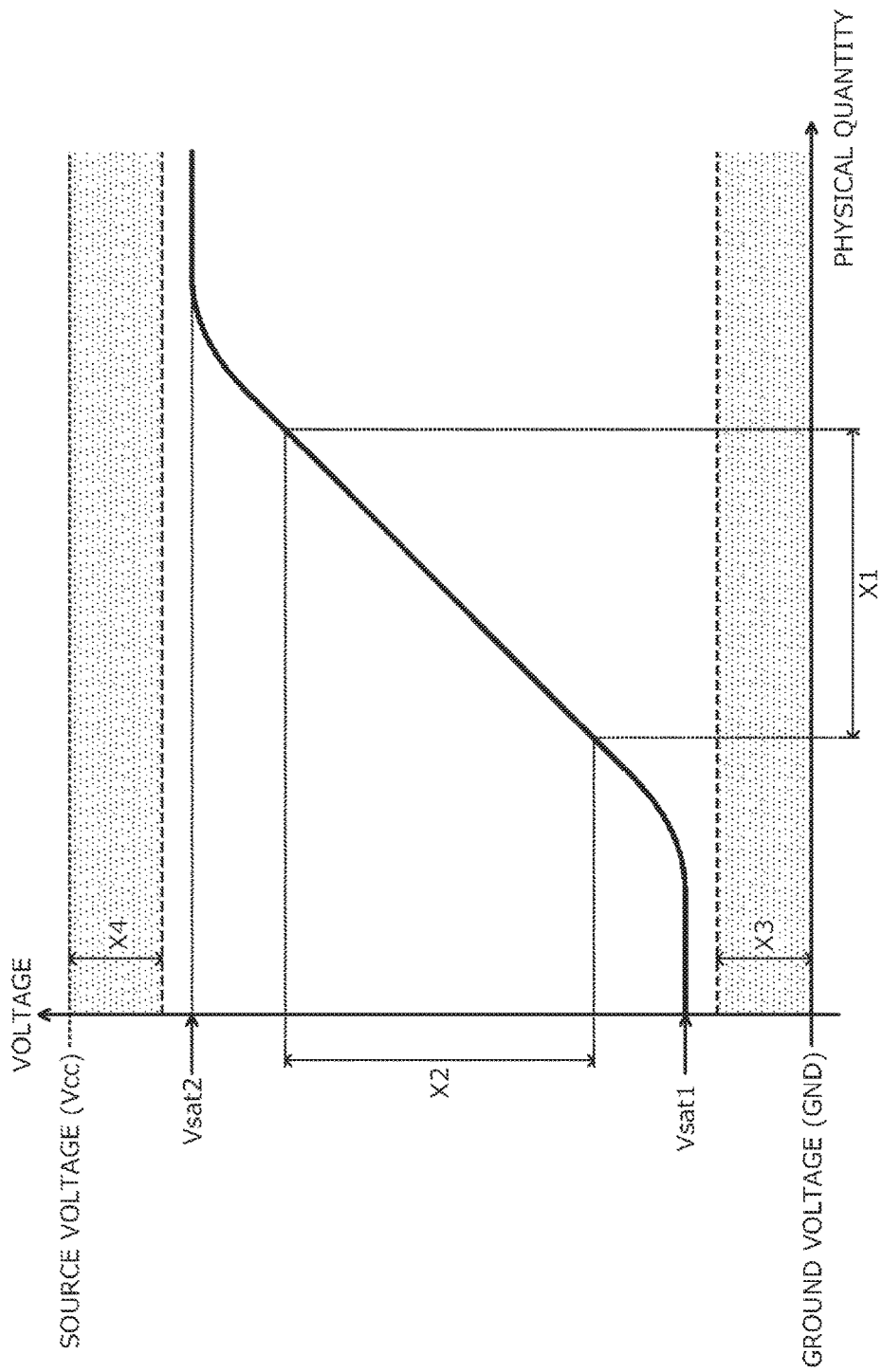
FIGS. 8 and 9 are diagrams depicting a voltage range of a conventional sensor IC device.
Figure 9:
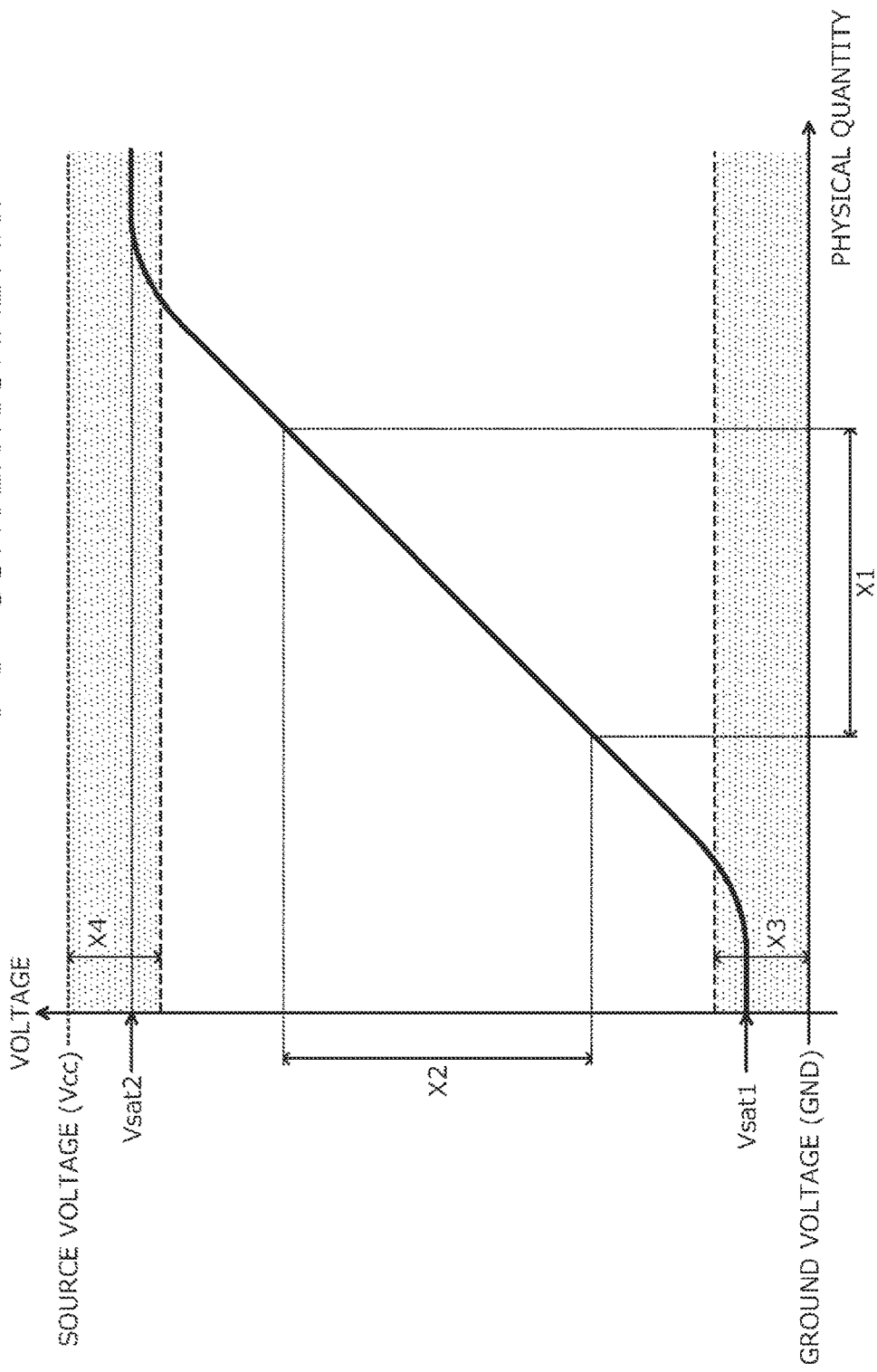

Configuration of the sensor system 110 and connection configuration of the sensor IC device 10 and the sensor system 110 is similar to that in FIG. 7 when reference character 100 in FIG. 7 is replaced with reference character 10. Therefore, description thereof is omitted herein. Further, in the sensor IC device 10, similar to the sensor IC device depicted in FIG. 7, resistors 121 to 125 are connected. The resistors 121 to 123 are internal diagnostic resistors and the resistor 124 is an external resistor. The resistors 121 to 124 constitute a self-diagnosis function for detecting connection error of the sensor IC device 10 and the sensor system 110. The resistor 125 is a low pass filter that removes a high-frequency component of the output of an output circuit 5.

The resistance values of the resistors 121 to 124 are determined so that the voltage (voltage of the output terminal 103) Vout output from the sensor IC device 10 when a connection error occurs such as when the connection of power source output terminals of the sensor IC device 10 and of the sensor system 110 become open is fixed to a voltage value within the error detection voltage ranges X3, X4. The error detection voltage ranges X3, X4 are set outside the normal output voltage range X2 of the sensor IC device 10. The resistance value of the resistor 125 is low to an extent that the current capacity during normal operation of the sensor IC device 10 does not decrease, for example, a few ten Ohms (Ω).

The sensor IC device 10 described above includes a sensor element 30, first and second switching output elements 1, 2, first and second switching elements 3, 4, first to fourth operational amplifiers 21 to 24, an AND (logical AND) circuit 25, an OR (logical OR) circuit 26, and an amplifier-circuit operational amplifier 17. According to one embodiment, outputs of a sensor may be connected to the gate electrodes of the p-channel MOSFETs 11 and 12 of a differential input unit. The sensor element 30 generates an electronic signal corresponding to a detected physical quantity or force. For example, a pressure may be generated and detected by the sensor element 30 or exerted on the sensor element 30. The electronic signal generated by the sensor element 30 is output from the output terminal 103 to an external destination, via the output circuit 5. While an example of a sensor element 30 connected at the terminals A, B of the differential input unit is provided, it is understood that embodiments of the invention include variations including intervening elements, such as filters, buffers, and other circuitry and elements for processing sensor inputs.

The output circuit 5 is constituted by the first and second switching output elements 1, 2 and the first and second switching elements 3, 4. The first switching output element 1 and the first switching element 3 are each an n-channel MOSFET. The second switching output element 2 and the second switching element 4 are each a p-channel MOSFET. The p-channel MOSFET arranged on the high potential side and the n-channel MOSFET arranged on the low potential side are connected so as to be complementary, forming a CMOS circuit. The first switching output element 1 is connected to an output point 6 of the output circuit 5, via the first switching element 3; and the second switching output element 2 is connected to the output point 6 of the output circuit 5, via the second switching element 4. The output point 6 of the output circuit 5 is connected to the output terminal 103.

The amplifier-circuit operational amplifier 17 and non-depicted voltage divider resistors constitute a negative feedback amplifier circuit. The amplifier-circuit operational amplifier 17 includes the first and second switching output elements 1, 2, the first and second switching elements 3, 4, a constant current source Iref, a phase compensation capacitor 7, p-channel MOSFETs 8, 9, 11, 12, and n-channel MOSFETs 13 to 16. The constant current source Iref, the p-channel MOSFETs 8, 9 and the second switching output element 2 are connected to a wiring line of the potential of the internal source voltage Vdd on the high potential side of the power source of the negative feedback amplifier circuit.

The n-channel MOSFETs 13 to 16 and the first switching output element 1 are connected to a wiring line of the potential of the ground voltage GND that is the low potential side of the power source of the negative feedback amplifier circuit. An internal source voltage (Vdd) terminal is connected to the source voltage terminal 101 of the sensor IC device 10, via an overvoltage protection element (not depicted). The internal source voltage Vdd is set to a voltage value of the source voltage Vcc or lower. The phase compensation capacitor 7 is connected between the output point 6 of the output circuit 5 and an output point of the differential input unit (comprising p-channel MOSFETs 11, 12 and n-channel MOSFETs 13, 14).

The first and second switching elements 3, 4, the first to fourth operational amplifiers 21 to 24, the AND circuit 25, and the OR circuit 26 constitute an output adjusting circuit 20 that acts as a clamp circuit that clamps (limits) the voltage Vout of the output terminal 103. The first switching element 3 is an n-channel MOSFET arranged between the first switching output element 1 and the output terminal 103, connected in series to the first switching output element 1. In other words, the source of the first switching element 3 is connected to the drain of the first switching output element 1 and the drain is connected to the output point 6 of the output circuit 5. The gate of the first switching element 3 is connected to the output terminal of the AND circuit 25.

The second switching element 4 is a p-channel MOSFET arranged between the second switching output element 2 and the output terminal 103, connected in series to the second switching output element 2. In particular, the source of the second switching element 4 is connected to the drain of the second switching output element 2 and the drain is connected to the output point 6 of the output circuit 5. The gate of the second switching element 4 is connected to the output terminal of the OR circuit 26.

The non-inverting input (+) terminal of the first operational amplifier 21 is connected to the output terminal 103 and the inverting input (−) terminal is fixed to the potential of the predetermined reference voltage Vref1. The output terminal of the first operational amplifier 21 is connected to one input terminal of the AND circuit 25. The reference voltage Vref1 of the first operational amplifier 21 is the lower limit value of the range of the voltage Vout of the output terminal 103. The reference voltage Vref1 of the first operational amplifier 21 is set to be higher than the upper limit of the error detection voltage range X3 on the lower limit side (the ground voltage GND side) and to be the lower limit of the normal output voltage range X2 or lower.

In other words, when the voltage Vout of the output terminal 103 is lower than the reference voltage Vref1 (Vout<Vref1), the first operational amplifier 21 is set so that voltage of the low (L) voltage level (L level) is output to the AND circuit 25. The first operational amplifier 21 has a function of clamping the voltage Vout of the output terminal 103 to the reference voltage Vref1.

The non-inverting input (+) terminal of the second operational amplifier 22 is connected to the output terminal 103 and the inverting input (−) terminal is fixed to the potential of the predetermined reference voltage Vref2. The output terminal of the second operational amplifier 22 is connected to one input terminal of the OR circuit 26. The reference voltage Vref2 of the second operational amplifier 22 is the upper limit of the range of the voltage Vout of the output terminal 103. The reference voltage Vref2 of the second operational amplifier 22 is set to be lower than the lower limit of the error detection voltage range X4 on the upper limit side (the source voltage Vcc side) and to be the upper limit of the normal output voltage range X2 or higher.

In other words, when the voltage Vout of the output terminal 103 is the reference voltage Vref2 or greater (Vout≥Vref2), the second operational amplifier 22 is set so that voltage of a high (H) voltage level (hereinafter, H level) is output to the OR circuit 26. The second operational amplifier 22 has a function of clamping the voltage Vout of the output terminal 103 to the reference voltage Vref2.

The non-inverting input (+) terminal of the third operational amplifier 23 is fixed to the potential of a predetermined reference voltage (third voltage) Vref0 and the inverting input (−) terminal is connected to the output terminal 103. The output terminal of the third operational amplifier 23 is connected to the other input terminal of the OR circuit 26. The reference voltage Vref0 of the third operational amplifier 23 is set to a voltage value higher than the upper limit of the error detection voltage range X3 on the lower limit side and within a voltage range X5 lower than the reference voltage Vref1 of the first operational amplifier 21. When output voltage (the voltage Vout) at the time of short circuiting is clearly lower than the upper limit of the error detection voltage range X3 on the lower limit side, the reference voltage Vref1 of the first operational amplifier 21 may be set within the error detection voltage range X on the lower limit side.

In other words, when the voltage Vout of the output terminal 103 is the reference voltage Vref0 or less (Vout≤Vref0), the third operational amplifier 23 may be set to output H level voltage to the OR circuit 26. The third operational amplifier 23, the OR circuit 26, and the second switching element 4 have a function of turning OFF the second switching element 4 when the ground voltage terminal 102 and the output terminal 103 short circuit, suppressing the flow of current in the sensor IC device 10 (hereinafter, short circuit current).

The non-inverting input (+) terminal of the fourth operational amplifier 24 is fixed to the potential of a predetermined reference voltage (fourth voltage) Vref3 and the inverting input (−) terminal is connected to the output terminal 103. The output terminal of the fourth operational amplifier 24 is connected to the other input terminal of the AND circuit 25. The reference voltage Vref3 of the fourth operational amplifier 24 is set to a voltage value that is higher than the reference voltage Vref2 of the second operational amplifier 22 and that is within a voltage range X6 less than the lower limit of the error detection voltage range X4 on the upper limit side. When output voltage (the voltage Vout) at the time of short circuiting is clearly higher than the lower limit of the error detection voltage range X4 on the upper limit side, the reference voltage Vref2 of the second operational amplifier 22 may be set to be within the error detection voltage range X4 on the upper limit side.

In other words, when the voltage Vout of the output terminal 103 is higher than the reference voltage Vref3 (Vout>Vref3), the fourth operational amplifier 24 may be set to output L level voltage to the AND circuit 25. The fourth operational amplifier 24, the AND circuit 25, and the first switching element 3 have a function of turning OFF the first switching element 3 when the source voltage terminal 101 and the output terminal 103 short circuit, suppressing short circuit current.

Operation of the first and second switching elements 3, 4 of the sensor IC device 10 will be described with reference to FIGS. 1, 2A, and 2B. FIG. 2B is a table of component operation during operation of the semiconductor physical quantity sensing device according to the embodiment.

The voltage Vout of the output terminal 103 is assumed to be a voltage value (Vout≤Vref0) in a range equal to or less than the reference voltage Vref0 the third operational amplifier 23 (hereinafter, first operation state). The first operation state is an operation state at the time of short circuiting of the output terminal 103 and the ground voltage terminal 102 of the sensor IC device 10. In this case, since the voltage on the inverting input terminal side of the first operational amplifier 21 is higher than the voltage on the non-inverting input terminal side, the output of the first operational amplifier 21 is inverted becoming the L level. Since the voltage on the inverting input terminal side of the fourth operational amplifier 24 is lower than the voltage on the non-inverting input terminal side, the output of the fourth operational amplifier 24 is the H level. The AND circuit 25 receives input of the L level voltage and the H level voltage from the first and fourth operational amplifiers 21, 24, outputs the L level voltage, and turns OFF (OFF) the first switching element 3. Further, since the voltage on the inverting input terminal side of the second operational amplifier 22 is higher than the voltage on the non-inverting input terminal side, the output of the second operational amplifier 22 is inverted becoming the L level. Since the voltage on the inverting input terminal side of the third operational amplifier 23 is the voltage on the non-inverting input terminal side or lower, the output of the third operational amplifier 23 is the H level. The OR circuit 26 receives input of the L level voltage and the H level voltage from the second and third operational amplifiers 22, 23, outputs the H level voltage, and turns OFF the second switching element 4.

The voltage Vout of the output terminal 103 is assumed to change from a value less than or equal to the reference voltage Vref2 of the second operational amplifier 22 greater than or equal to the reference voltage Vref1 of the first operational amplifier 21, to a voltage value (Vref0<Vout<Vref1) in a range higher than the reference voltage Vref0 of the third operational amplifier 23 and lower than the reference voltage Vref1 of the first operational amplifier 21 (hereinafter, second operation state). In this case, since the voltage on the inverting input terminal side of the first operational amplifier 21 is higher than the voltage on the non-inverting input terminal side, the output of the first operational amplifier 21 is inverted becoming the L level. Since the voltage on the inverting input terminal side of the fourth operational amplifier 24 is lower than voltage on the non-inverting input terminal side, the output of the fourth operational amplifier 24 is the H level. The AND circuit 25 receives input of the L level voltage and the H level voltage from the first and fourth operational amplifiers 21, 24, outputs the L level voltage, and turns OFF the first switching element 3. The first switching element 3 is turned OFF whereby decreases of the output of the sensor IC device 10 are stopped and the voltage Vout of the output terminal 103 is clamped to the reference voltage Vref1 of the first operational amplifier 21. Since the voltage on the inverting input terminal side of the second operational amplifier 22 is higher than the voltage on the non-inverting input terminal side, the output of the second operational amplifier 22 is inverted becoming the L level. Since the voltage on the inverting input terminal side of the third operational amplifier 23 is higher than the voltage on the non-inverting input terminal side, the output of the third operational amplifier 23 is inverted becoming the L level. The OR circuit 26 receives input of the L level voltage from the second and third operational amplifiers 22, 23, outputs the L level voltage, and turns ON the second switching element 4.

The voltage Vout of the output terminal 103 is assumed to be a voltage value (Vref1≤Vout<Vref2) in a range equal to greater than the reference voltage Vref1 of the first operational amplifier 21 and less than the reference voltage Vref2 of the second operational amplifier 22 (hereinafter, third operation state). Within this voltage range, the normal output voltage range X2 of the sensor IC device 10 is included. In other words, the third operation state is an operation state during normal operation of the sensor IC device 10. In this case, since the voltage on the inverting input terminal side of the first operational amplifier 21 is the voltage on the non-inverting input terminal side or less, the output of the first operational amplifier 21 is the H level. Since the voltage on the inverting input terminal side of the fourth operational amplifier 24 is lower than voltage on the non-inverting input terminal side, the output of the fourth operational amplifier 24 is the H level. The AND circuit 25 receives input of the H level voltage from the first and fourth operational amplifiers 21, 24, outputs the H level voltage, and turns ON the first switching element 3. Additionally, since the voltage on the inverting input terminal side of the second operational amplifier 22 is higher than voltage on the non-inverting input terminal side, the output of the second operational amplifier 22 is inverted becoming the L level. Since the voltage on the inverting input terminal side of the third operational amplifier 23 is higher than the voltage on the non-inverting input terminal side, the output of the third operational amplifier 23 is inverted becoming the L level. The OR circuit 26 receives input of the L level voltage from the second and third operational amplifiers 22, 23, outputs the L level voltage, and turns ON the second switching element 4.

The voltage Vout of the output terminal 103 is assumed to change from a value equal to or less than the reference voltage Vref2 of the second operational amplifier 22 equal to or greater than the reference voltage Vref1 of the first operational amplifier 21, to a voltage value (Vref2≤Vout≤Vref3) in a range equal to or greater than the reference voltage Vref2 of the second operational amplifier 22 and equal to or less than the reference voltage Vref3 of the fourth operational amplifier 24 (hereinafter, fourth operation state). In this case, since the voltage on the inverting input terminal side of the first operational amplifier 21 is less than the voltage on the non-inverting input terminal side, the output of the first operational amplifier 21 is the H level. Since the voltage on the inverting input terminal side of the fourth operational amplifier 24 is the voltage on the non-inverting input terminal side or less, the output of the fourth operational amplifier 24 is the H level. The AND circuit 25 receives the H level voltage from the first and fourth operational amplifiers 21, 24, outputs the H level voltage, and turns ON the first switching element 3. Further, since the voltage on the inverting input terminal side of the second operational amplifier 22 is the voltage on the non-inverting input terminal side or lower, the output of the second operational amplifier 22 is the H level. Since the voltage on the inverting input terminal side of the third operational amplifier 23 is higher than voltage on the non-inverting input terminal side, the output of the third operational amplifier 23 is inverted becoming the L level. The OR circuit 26 receives input of the H level voltage and the L level voltage of the second and third operational amplifiers 22, 23, outputs the H level voltage, and turns OFF the second switching element 4. The second switching element 4 is turned OFF whereby increases of the output of the sensor IC device 10 are stopped and the voltage Vout of the output terminal 103 is clamped to the reference voltage Vref2 of the second operational amplifier 22.

The voltage Vout of the output terminal 103 is assumed to be a voltage value (Vref3<Vout) within a range higher than the reference voltage Vref3 of the fourth operational amplifier 24 (hereinafter, fifth operation state). The fifth operation state is an operation state when the output terminal 103 and the ground voltage terminal 102 of the sensor IC device 10 short circuit. In this case, since the voltage on the inverting input terminal side of the first operational amplifier 21 is lower than the voltage on the non-inverting input terminal side, the output of the first operational amplifier 21 is the H level. Since the voltage on the inverting input terminal side of the fourth operational amplifier 24 is higher than the voltage on the non-inverting input terminal side, the output of the fourth operational amplifier 24 is inverted becoming the L level. The AND circuit 25 receives input of the H level voltage and the L level voltage from the first and fourth operational amplifiers 21, 24, outputs the L level voltage, and turns OFF the first switching element 3. Further, since the voltage on the inverting input terminal side of the second operational amplifier 22 is lower than the voltage on the non-inverting input terminal side, the output of the second operational amplifier 22 is the H level. Since the voltage on the inverting input terminal side of the third operational amplifier 23 is higher than the voltage on the non-inverting input terminal side, the output of the third operational amplifier 23 is inverted becoming the L level. The OR circuit 26 receives input of the H level voltage and the L level voltage from the second and third operational amplifiers 22, 23, outputs the H level voltage, and turns OFF the second switching element 4.

In this manner, when the voltage Vout of the output terminal 103 is clamped (the second and fourth operation states), either the first switching element 3 or the second switching element 4 is ON. The reason for this is that when the voltage Vout of the output terminal 103 is clamped and the first and second switching elements 3, 4 are OFF, the output terminal 103 assumes the floating potential whereby leak current between the various circuit components connected to the output terminal 103 flows. In the present invention, when the voltage Vout of the output terminal 103 is clamped, one of the first and second switching elements 3, 4 is ON whereby the voltage Vout of the output terminal 103 is held by a voltage value of a certain extent and the output of the sensor IC device 10 is prevented from becoming unstable. On the other hand, even when short circuiting between the terminals of the sensor IC device 10 occurs (the first and fifth states) whereby the output of the sensor IC device 10 is errant voltage and unreliable, making the output of the sensor IC device 10 become unstable, no problem arises. Therefore, the first and second switching elements 3, 4 are turned OFF, the output terminal 103 assumes the floating potential, and the output of the sensor IC device 10 is stopped.

Figure 3:
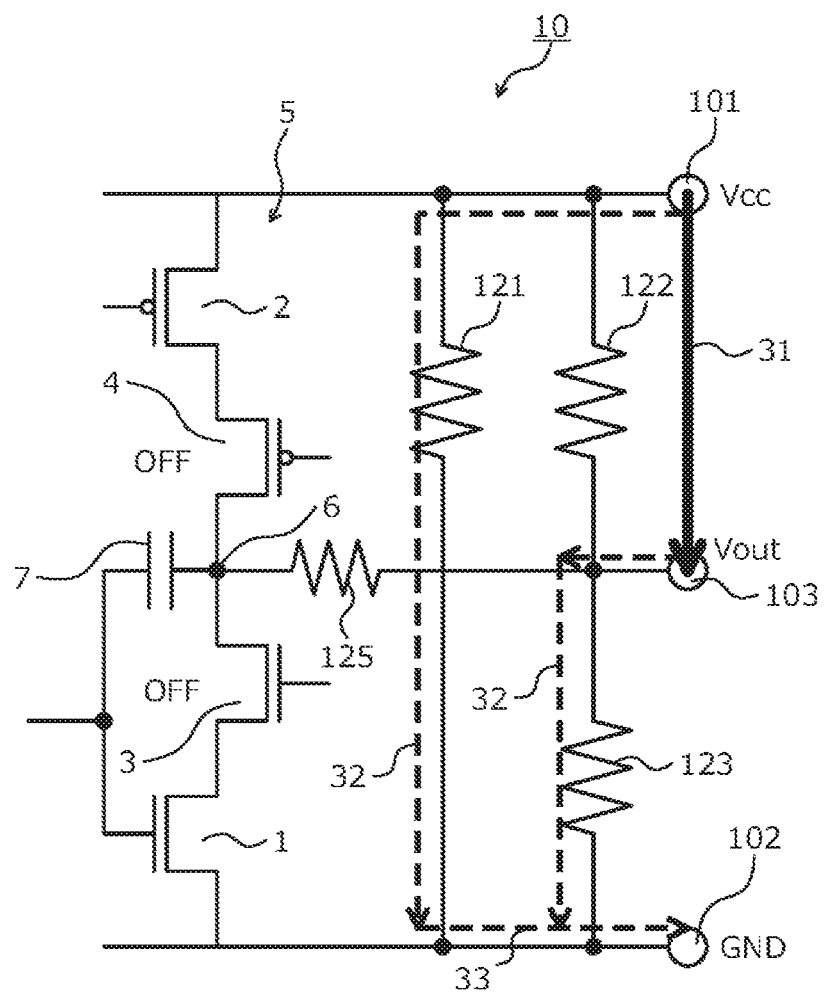
FIGS. 3 and 4 are diagrams of current paths at the time of short circuiting between terminals of the semiconductor sensing device according to the embodiment.
Figure 4:
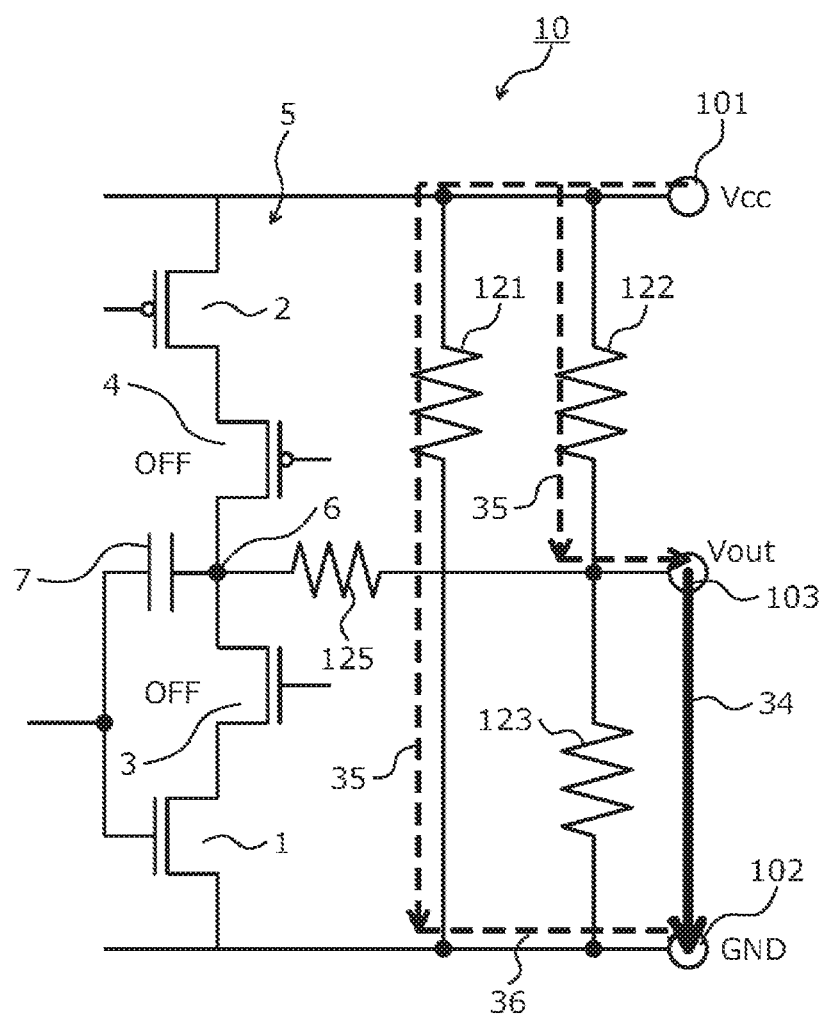
Figure 5:
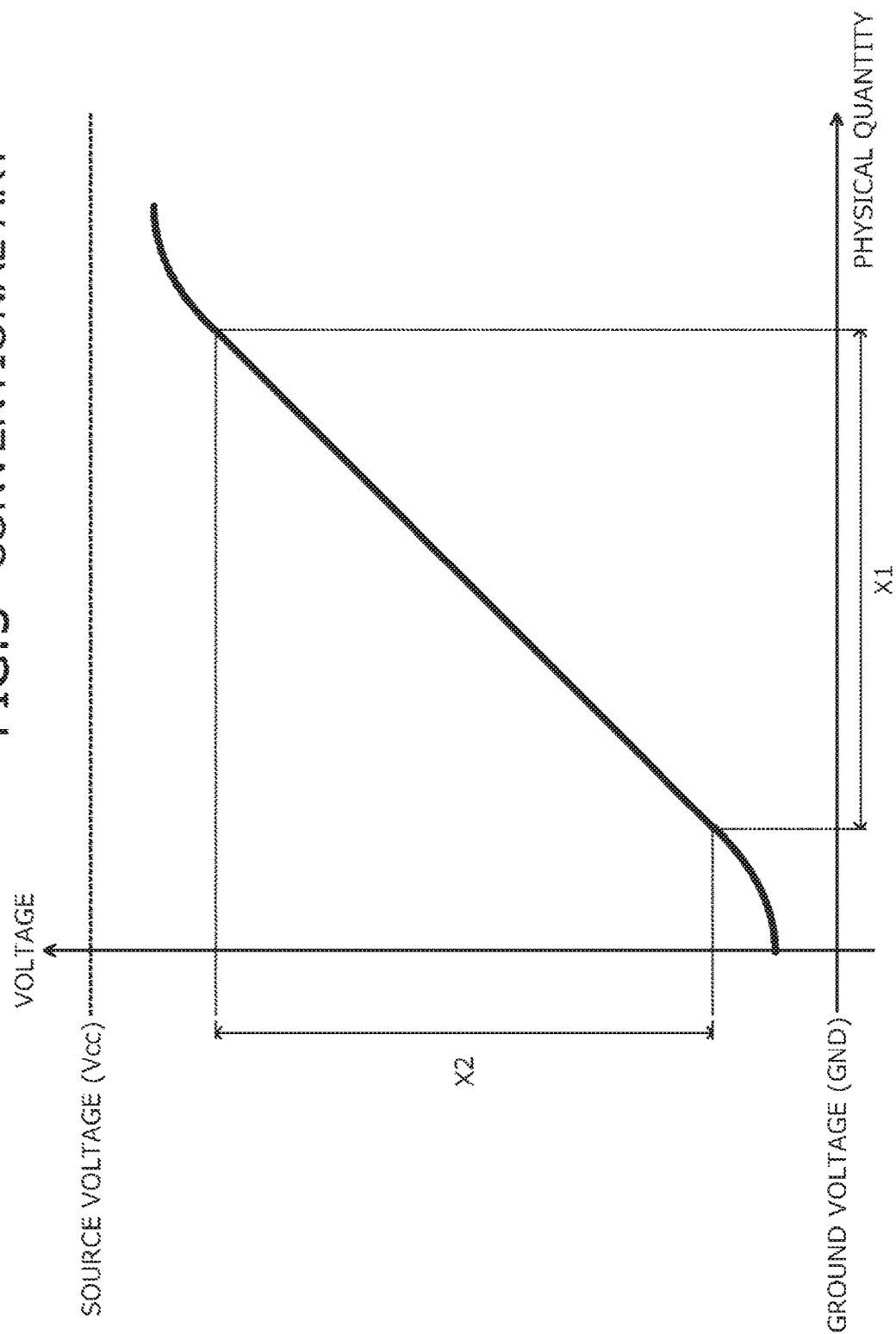
FIG. 5 is a characteristics diagram of output characteristics of a conventional sensor IC device.
Figure 6:
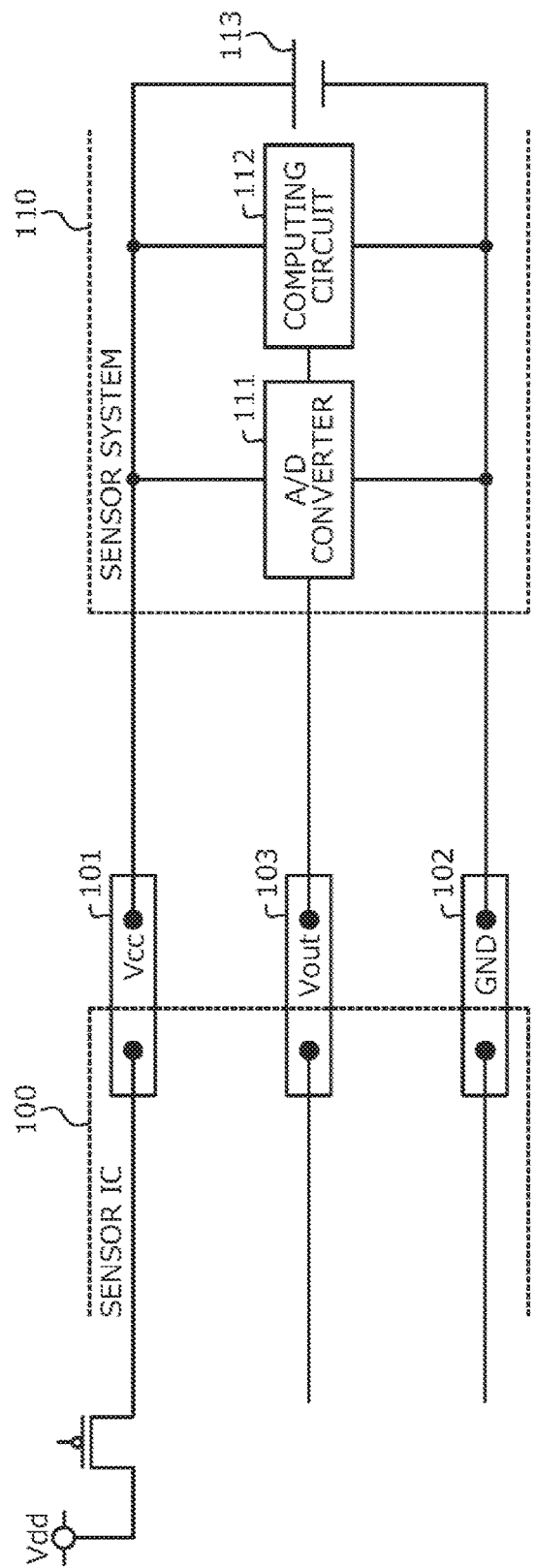
FIG. 6 is a block diagram depicting a connection configuration of a sensor IC device and a sensor system.

Operation when short circuiting between the terminals of the sensor IC device 10 occurs will be described. FIGS. 3 and 4 are diagrams of current paths at the time of short circuiting between the terminals of the semiconductor physical quantity sensing device according to the embodiment. When the source voltage terminal 101 and the output terminal 103 of the sensor IC device 10 short circuit, the output terminal 103 assumes the potential of the source voltage Vcc of substantially the same potential as the source voltage terminal 101 and the voltage Vout of the output terminal 103 becomes a voltage value within the error detection voltage range X4 on the upper limit side. Therefore, the voltage Vout of the output terminal 103 becomes higher than the reference voltage Vref3 of the fourth operational amplifier 24 and as described above, the first and second switching elements 3, 4 are turned OFF (i.e., the fifth operation state). As a result, since the output terminal 103 assumes the floating potential, high impedance (Hi-Z) results and no current path through the first switching output element 1 on the low side is formed as is conventionally. In other words, as depicted in FIG. 3, current at the time of short circuiting flows through a path of the source voltage terminal 101, the output terminal 103, the combine resistance of the resistors 121, 123, and the ground voltage terminal 102. In FIG. 3, a current path from the source voltage terminal 101 toward the output terminal 103 is indicated by reference numeral 31, a current path flowing through the combine resistance of the resistors 121, 123 is indicated by reference numeral 32, and a current path from the combine resistance of the resistors 121, 123 toward the ground voltage terminal 102 is indicated by reference numeral 33.

On the other hand, when the ground voltage terminal 102 and the output terminal 103 of the sensor IC device 10 short circuit, the output terminal 103 assumes the potential of the ground voltage GND of substantially the same potential as the ground voltage terminal 102 and the voltage Vout of the output terminal 103 becomes a voltage value within the error detection voltage range X3 on the lower limit side. Therefore, the voltage Vout of the output terminal 103 becomes the reference voltage Vref0 of the third operational amplifier 23 or less and as described above, the first and second switching elements 3, 4 are turned OFF (i.e., the first operation state). As a result, since the output terminal 103 assumes the floating potential, high impedance results and no current path through the second switching output element 2 on the low side is formed as is conventionally. In other words, as depicted in FIG. 4, the current at the time of short circuiting flows through a path of the source voltage terminal 101, the combine resistance of the resistors 121, 122, the output terminal 103, and the ground voltage terminal 102. In FIG. 4, a current path from the output terminal 103 toward the ground voltage terminal 102 is indicated by reference numeral 34, a current path flowing through the combined resistance of the resistors 121, 122 is indicated by reference numeral 35, and a current path from the combined resistance of the resistors 121, 122 toward the ground voltage terminal 102 is indicated by reference numeral 36.

The resistors 121 to 123 connected to the source voltage terminal 101, the ground voltage terminal 102, and the output terminal 103, respectively, and constituting the internal diagnosis function are set to about a few ten kilo-Ohms (kΩ) or more. Therefore, if the current at the time of short circuiting flows through the current paths 31 to 36 described above, even when the source voltage Vcc is about 5V, the current at the time of short circuiting may be suppressed to a few mA or less.

As described above, according to the embodiments, a clamp circuit that clamps the voltage of the output terminal is configured using the first and second switching elements, the first to fourth operational amplifiers, the AND circuit, and the OR circuit as described above. As a result, when short circuiting between the terminals of the sensor IC device occurs, the first and second switching elements may be turned OFF and no current path passing through the first and second switching output elements is formed. Therefore, without increasing the ON resistance values of the first and second switching output elements or increasing the resistance value of the low pass filter, the current at the time of short circuiting may be suppressed by adjusting the resistance value of the external resistor, the internal diagnostic resistors, etc. Further, since increasing the ON resistance values of the first and second switching output elements and increasing the resistance value of the low pass filter are unnecessary, during normal operation (voltage output within the normal output voltage range) of the sensor IC device, increased output impedance may be prevented. Therefore, the current capacity during normal operation of the sensor IC device may be maintained and when short circuiting between the terminals of the sensor IC device occurs, short circuit current may be suppressed.

The present invention is not limited to the embodiments described above and various modifications not deviating from the spirit if the invention are possible. For example, in the semiconductor sensing device according to the present invention, the detectable physical quantity may be pressure, speed, acceleration, or the like.

Figure 10:
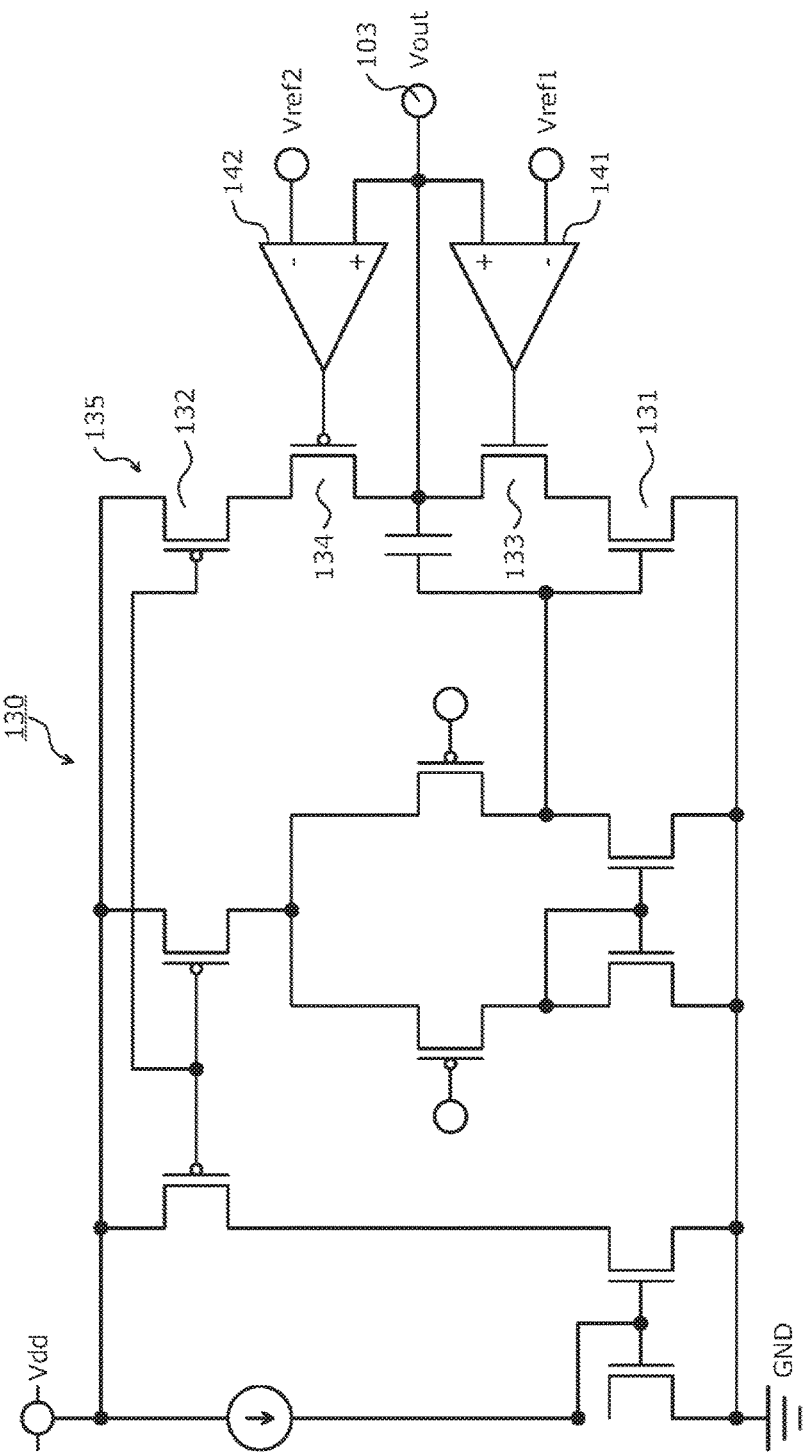
FIG. 10 is a circuit diagram of a conventional sensor IC device.
Figure 11:
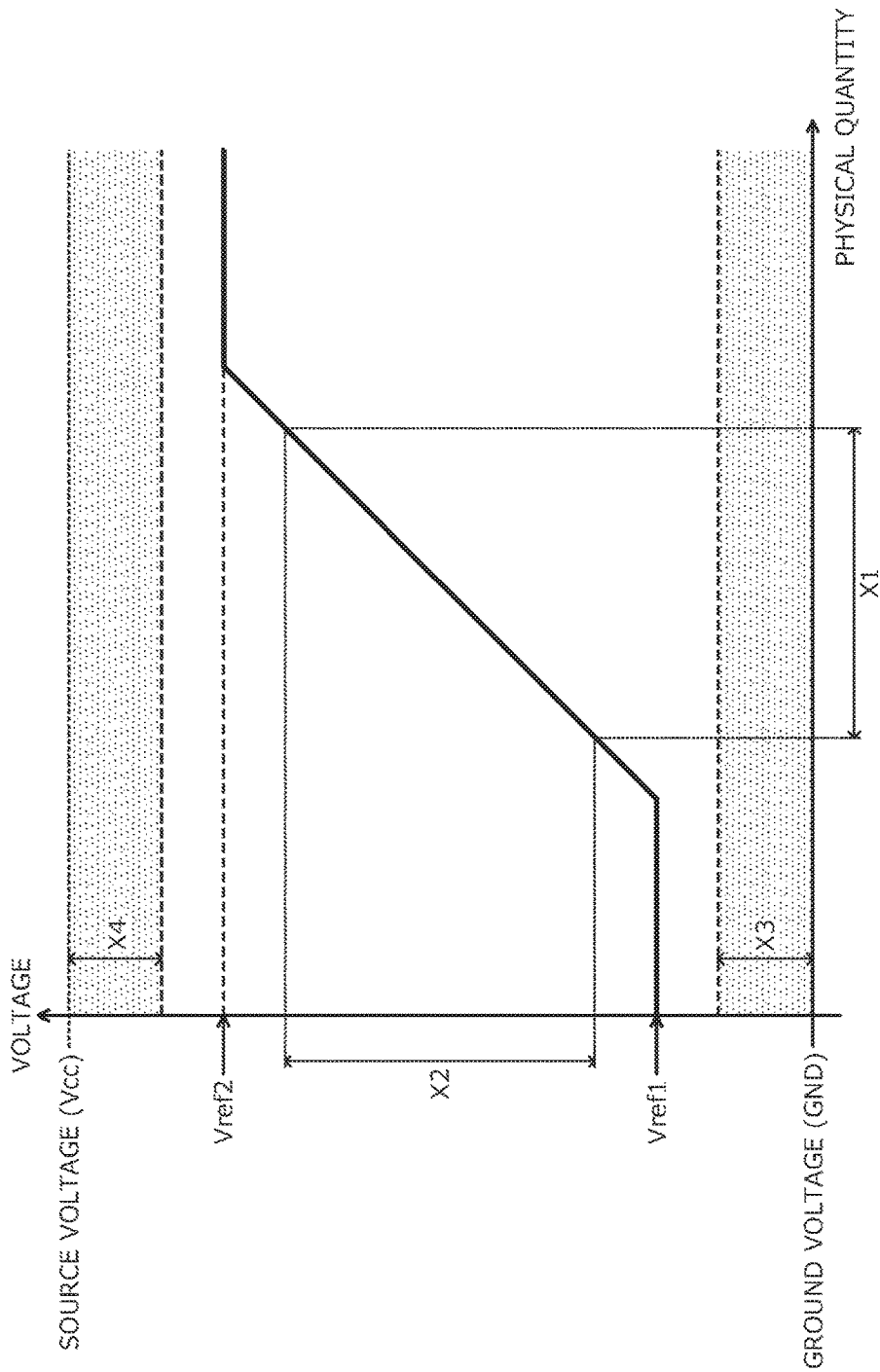
FIG. 11 is a diagram of another example of a voltage range of the conventional sensor IC device.
Figure 12:
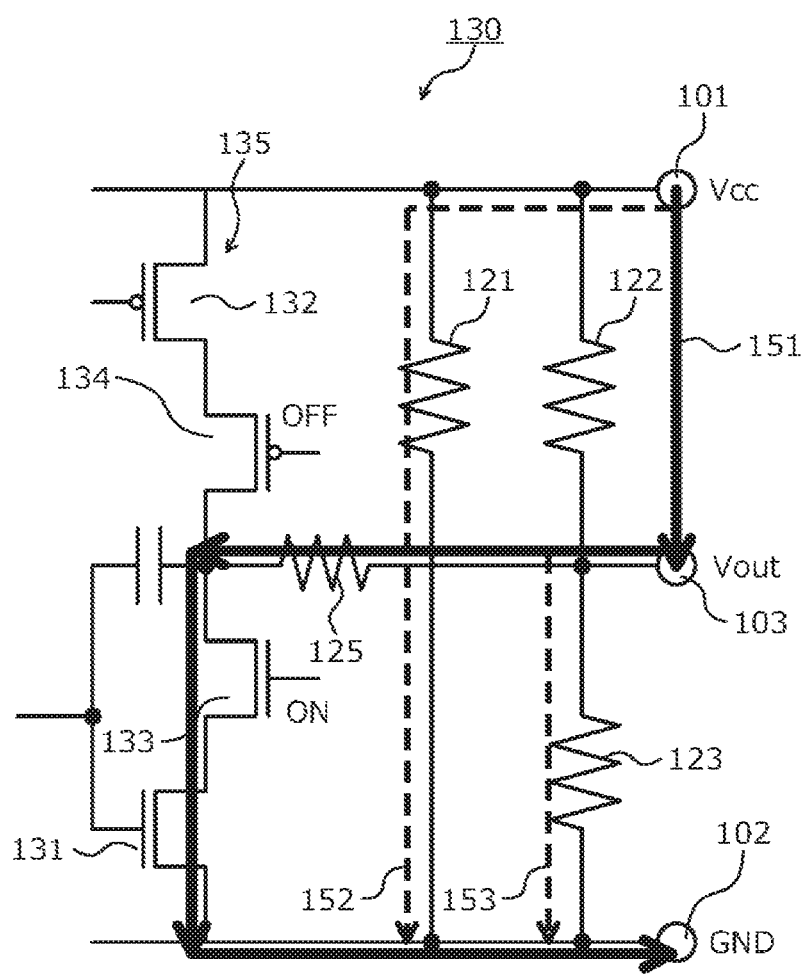
FIGS. 12 and 13 are diagrams depicting current paths during short circuiting between terminals of the conventional sensor IC device.
Figure 13:
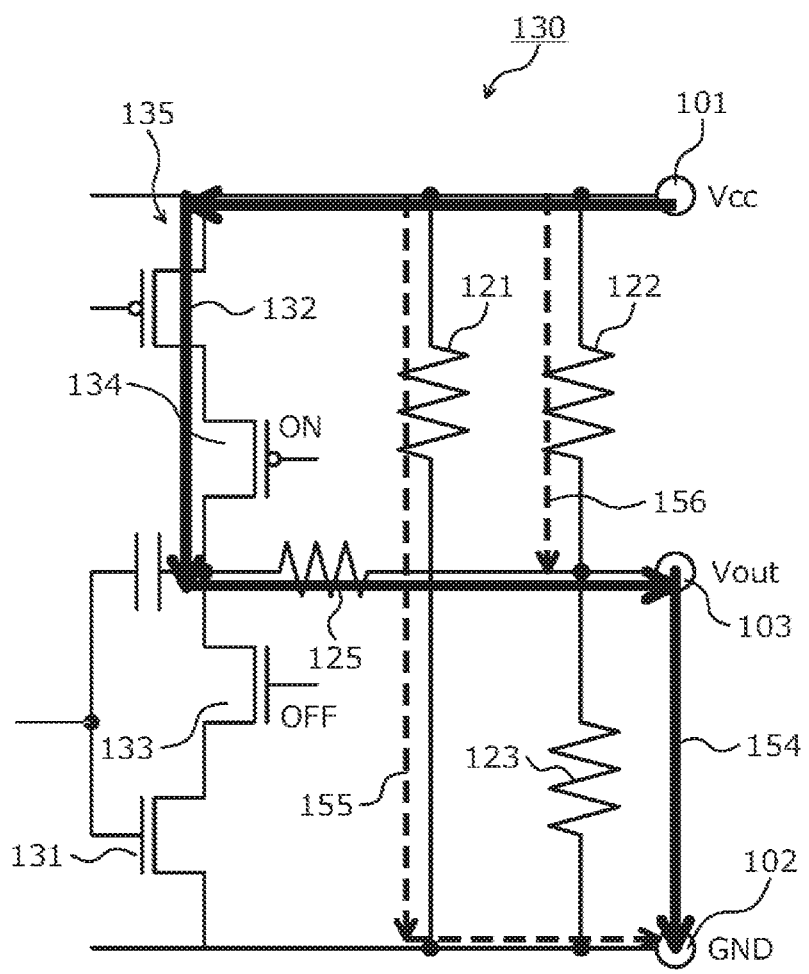

Nonetheless, in the conventional sensor IC device 130 depicted in FIG. 10 described above, when short circuiting of the source voltage terminal 101 and the output terminal 103 or short circuiting of the ground voltage terminal 102 and the output terminal 103 occurs, a large current flows through a path passing the short-circuit point. Therefore, as described above, in the sensor IC device 130, not only is setting of the voltage Vout of the output terminal 103 to be outside the error detection voltage ranges X3, X4 demanded, but a function that suppresses current during short circuiting between terminals is demanded. FIGS. 12 and 13 are diagrams depicting current paths during short circuiting between terminals of the conventional sensor IC device.

In particular, when the source voltage terminal 101 and the output terminal 103 of the sensor IC device 130 short circuit, the voltage applied to the output terminal 103 becomes a voltage close to the source voltage Vcc applied to the source voltage terminal 101 and exceeds the reference voltage Vref2 of the second operational amplifier 142. Therefore, although the second switching element 134 is turned off (OFF), the voltage applied to the output terminal 103 becomes the reference voltage Vref1 of the first operational amplifier 141 or higher whereby the first switching element 133 is turned on (ON). Therefore, as depicted in FIG. 12, mainly, a large current 151 flows through a path of the first output element 131 on the low side (low potential side) of the source voltage terminal 101, the output terminal 103, and the output circuit 135 and the ground voltage terminal 102. Reference characters 152, 153 are currents flowing through other paths when the source voltage terminal 101 and the output terminal 103 of the sensor IC device 130 short circuit.

On the other hand, when the ground voltage terminal 102 and the output terminal 103 of the sensor IC device 130 short circuit, the voltage applied to the output terminal 103 becomes a voltage close to the ground voltage GND applied to the ground voltage terminal 102 and is lower than the reference voltage Vref1 of the first operational amplifier 141. Therefore, although the first switching element 133 is turned off (OFF), the voltage applied to the output terminal 103 becomes less than the reference voltage Vref2 of the second operational amplifier 142 whereby the second switching element 134 is turned on (ON). Therefore, as depicted in FIG. 13, mainly, a large current 154 flows through a path of the second output element 132 on the high side (high potential side) of the source voltage terminal 101 and the output circuit 135, the output terminal 103, and the ground voltage terminal 102. Reference characters 155, 156 are currents flowing through other paths when the ground voltage terminal 102 and the output terminal 103 of the sensor IC device 130 short circuit.

The ON resistance value of the MOSFET that is the first and second output elements 131, 132 may be increased as a method of suppressing the currents 151, 154 flowing in the sensor IC device 130 when short circuiting occurs between these terminals. Further, the resistance value of the low pass filter 125 that is arranged between the output circuit 135 and the output terminal 103 and that removes a high-frequency component of the output of the output circuit may be increased as another method. Nonetheless, when the ON resistance values of the first and second output elements 131, 132 or the resistance value of the low pass filter 125 is increased, the output impedance when voltage within the normal output voltage range of the sensor IC device 130 is output also increases, arising in a problem in that a sufficient current capacity is not obtained.

According to the present invention, when short circuiting occurs between terminals, the first and second switching elements may be turned OFF and a current path passing through the first and second switching output elements is not formed. Therefore, without increasing the ON resistance values of the first and second switching output elements or increasing the resistance value of the low pass filter, current at the time of short circuiting may be suppressed by adjusting the resistance value of the internal diagnostic resistor, the external resistor, etc. Further, since increasing the ON resistance value of the first and second switching output elements, increasing the resistance value of the low pass filter, etc. are unnecessary, increases in the output impedance during normal operation may be prevented.

The semiconductor sensing device according to the present invention achieves an effect in that the current capacity during normal operation of the sensor IC device may be maintained and when short circuiting between the terminals of the sensor IC device occurs, short circuit current may be suppressed.

As described, the semiconductor sensing device according to the present invention is useful for a sensor IC device that performs conversion to a voltage of a voltage value corresponding to the magnitude of the physical quantity and outputs the resulting voltage.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor sensing device configured to output an electronic signal of a voltage corresponding to a magnitude of a detected physical quantity or force, the semiconductor sensing device comprising:
a first switching output element having one terminal connected to a low-potential and another terminal having a higher potential than the one terminal;
a second switching output element connected on a high-potential side of the first switching output element, the first and second switching output elements being complementary, so as to perform switching operations based on receiving opposing input potential voltages;
a first switching element connected to the high potential side of the first switching output element, between the first switching output element and the second switching output element;
a second switching element connected between the first switching element and the second switching output element;
an output terminal connected to a connection point of the first switching element and the second switching element, the output terminal outputting to an external device the electronic signal having a potential of the connection point; and
an output adjustment circuit electrically connected to control inputs of the first and second switching elements,
wherein the output adjustment circuit is configured to turn off the first switching element when a voltage of the output terminal is less than a first voltage,
the output adjustment circuit is configured to turn off the second switching element when the voltage of the output terminal is a second voltage or higher, the second voltage being higher than the first voltage,
the output adjustment circuit is configured to turn off the second switching element when the voltage of the output terminal is equal to or lower than a third voltage, the third voltage being lower than the first voltage, and
the output adjustment circuit is configured to turn off the first switching element when the voltage of the output terminal is more than a fourth voltage, the fourth voltage being higher than the second voltage.

2. The semiconductor sensing device according to claim 1, wherein the output adjustment circuit is configured to turn on the first switching element when the voltage of the output terminal is the first voltage or higher and when the voltage of the output terminal is equal to or lower than the fourth voltage.

3. The semiconductor sensing device according to claim 1, wherein the output adjustment circuit is configured to turn on the second switching element when the voltage of the output terminal is higher than the third voltage and lower than the second voltage.

4. The semiconductor sensing device according to claim 1, wherein
the first switching element is an n-channel metal oxide semiconductor field effect transistor, and
the second switching element is a p-channel metal oxide semiconductor field effect transistor.

5. The semiconductor sensing device according to claim 1, wherein
the first switching output element is an n-channel metal oxide semiconductor field effect transistor, and
the second switching output element is a p-channel metal oxide semiconductor field effect transistor.

6. The semiconductor sensing device according to claim 1, comprising:
a first terminal of a maximum potential, connected on a high potential side of the second switching output element;
a second terminal of a minimum potential, connected on a low potential side of the first switching output element;
a first resistor connected between the first terminal and the second terminal;
a second resistor connected between the first terminal and the output terminal; and
a third resistor connected between the output terminal and the second terminal.

7. The semiconductor sensing device according to claim 1, further comprising a differential input unit comprising two or more transistors arranged to generated differential voltages, wherein the physical force is pressure, gate voltages to the two or more transistors are generated based on the pressure, and an input voltage is generated to the first and second switching output elements based on the outputs from the two or more transistors of the differential input unit.

8. The semiconductor sensing device according to claim 1, wherein the output adjustment circuit comprises:

a logical OR circuit connected to the control input of one of the first switching element and the second switching element, and having inputs based on signals output by a first set of one or more comparators; and a logical AND circuit connected to the control input of the other of the first switching element and the second switching element, and having inputs based on signals output by a second set of one or more comparators.

9. The semiconductor sensing device according to claim 8, wherein the first and second sets of one or more comparators all have one input electrically connected to the output terminal and a second input connected to reference voltages based on the first voltage, the second voltage, the third voltage, and the fourth voltage, respectively.

10. The semiconductor sensing device according to claim 1, wherein the output adjustment circuit comprises:

first, second, third, and fourth comparators each comparator having one input connected to the output terminal, the first comparator receiving at a second input a voltage based on the first voltage, the second comparator receiving at a second input a voltage based on the second voltage, the third comparator receiving at a second input a voltage based on the third voltage, and the fourth comparator receiving at a second input a voltage based on the fourth voltage;

a first logic circuit receiving as inputs outputs from the first and fourth comparators, and having an output connected to the control input of the first switching element; and a second logic circuit receiving as inputs outputs from the second and third comparators, and having an output connected to the control input of the second switching element.

* * * * *